(12) United States Patent
Horvat et al.

(10) Patent No.: US 6,914,946 B1
(45) Date of Patent: Jul. 5, 2005

(54) DIGITALLY-IMPLEMENTED DEMODULATOR

(75) Inventors: Dion Calvin Michael Horvat, New Westminster (CA); John Akira Tani, Vancouver (CA); Florin Jelea, Burnaby (CA)

(73) Assignee: VTech Communication, Ltd., Tai Po (HK)

( * ) Notice: Subject to any disclaimer, the term of this patent is extended or adjusted under 35 U.S.C. 154(b) by 715 days.

(21) Appl. No.: 09/696,410

(22) Filed: Oct. 25, 2000

(30) Foreign Application Priority Data

Dec. 17, 1999 (CA) .............................................. 2292463

(51) Int. Cl.$^7$ .............................................. H04L 27/14
(52) U.S. Cl. ...................... 375/334; 375/222; 375/150; 375/324; 365/477; 341/155; 327/96; 329/336
(58) Field of Search ................................ 375/334, 222, 375/150, 324; 329/336; 327/96; 341/155; 365/477; 382/218; 211/8; 455/214; 370/319

(56) References Cited

U.S. PATENT DOCUMENTS

| | | |
|---|---|---|
| 4,439,756 A | 3/1984 | Shenoi et al. |
| 4,506,228 A | 3/1985 | Kammeyer |
| 4,813,058 A | 3/1989 | Takase |
| 5,703,527 A * | 12/1997 | Iwasaki ........................ 329/336 |
| 5,825,756 A * | 10/1998 | Hattori ......................... 370/319 |
| 5,950,118 A * | 9/1999 | Freeburg et al. ............. 455/214 |
| 6,396,953 B1 * | 5/2002 | Abbey ......................... 382/218 |
| 6,664,849 B1 * | 12/2003 | Taura et al. ................. 329/315 |

FOREIGN PATENT DOCUMENTS

| | | |
|---|---|---|
| DE | 43 09 684 A1 | 9/1994 |
| EP | 00 31 0077 | 9/2002 |

OTHER PUBLICATIONS

Shoji Konda et al., "Significant Digit Requirement for FM Demodulation Using Digital Signal Processing," Electronics and Communications in Japan, Part I, vol. 73 (Feb. 1990).

* cited by examiner

*Primary Examiner*—Shuwang Liu
*Assistant Examiner*—Eva Zheng
(74) *Attorney, Agent, or Firm*—Pillsbury Winthrop Shaw Pittman LLP

(57) ABSTRACT

A digitally implemented demodulator. A frequency-modulated signal is applied to a limiting amplifier such that the signal amplitude is fixed at a constant level. The signal is undersampled and quadrature demodulated. The demodulator generates the cross-product of the baseband complex envelope to recover the original modulating signal. A digital Frequency Shift Keyed signal can be further recovered by applying the recovered signal to a data slicer to square-up the signal, and a matched filter for improved error resistance.

7 Claims, 5 Drawing Sheets

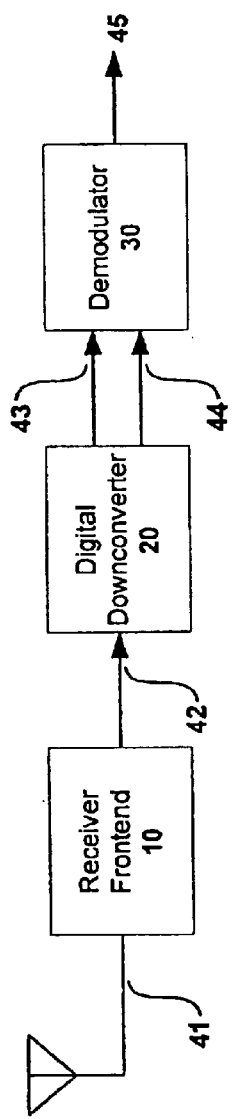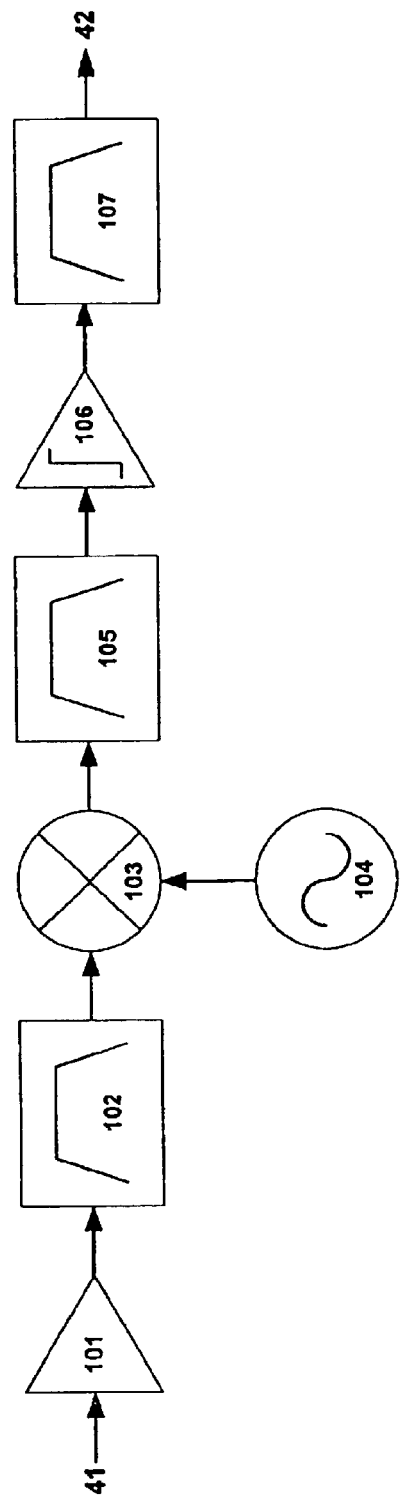
Figure 1
Figure 2

DIGITALLY-IMPLEMENTED DEMODULATOR

BACKGROUND OF THE INVENTION

1. Field of Invention

The present invention relates generally to a receiver for receiving a modulated signal. In particular, the present invention relates to a digitally-implemented demodulator for demodulating amplitude-independent modulated signals. While the present invention has utility in any system involving the transmission and reception of signals characterized by amplitude-independent coding/modulation, the invention has been disclosed in both analog FM and digital FSK wireless receiver embodiments.

2. Background Art

Frequency and phase modulated signals have long been popular for use in communications systems due to their superior noise resistance and tolerance to varying and unpredictable channel propagation characteristics, as compared with amplitude-modulated signals. Frequency modulation continues to be a very popular modulation scheme for the transmission of voice and music is systems employed by commercial radio stations, cellular telephones, and cordless telephones. Similarly, the easily-implemented Frequency Shift Key ("FSK") modulation schemes have become popular for the transmission of digital data in numerous contexts, such as telephone line modems, cellular telephones, and cordless telephones. Finally, phase modulation schemes such as BPSK and QPSK are integral to many very sophisticated modern communications systems, such as the CDMA digital cellular telephone standard.

While such modulation techniques have desirable characteristics, many conventional receiver and demodulator circuits have relied in large part on analog circuit components. While consumers demand wireless products having increasingly compact form factors, analog circuits incorporated in such products typically are often large, with high numbers of discrete parts. Furthermore, analog components tend to be subject to significant variations in manufacturing tolerances and are sensitive to environmental conditions and aging, which may degrade performance. A digitally-implemented receiver, however, would not be subject to such variability. Furthermore, a digital receiver could be integrated into a single application specific integrated circuit (ASIC), allowing a potentially drastic reduction in overall receiver size and part count. Therefore, it is an object of the present invention to implement a demodulator digitally.

Furthermore, prior art demodulators commonly require tuning or calibration during the manufacturing process, adding to the time and cost required to produce the products into which they are incorporated. It is a corresponding object of the invention to minimize or eliminate the tuning or calibration required during manufacture of a demodulator according to the present invention.

Receivers of conventional design typically utilize an automatic gain control amplifier to maintain the received signal within the dynamic range of the RF circuit. However, such receivers are typically limited in their reaction time, and may not always adjust quickly enough to accommodate drastic signal level transitions, such as may be caused by a frequency hopping receiver that hops into a null. Accordingly, it is an object of the present invention to implement a receiver that does not require an automatic gain control amplifier.

These and other objects of the present invention will become apparent in light of the present specification and drawings.

SUMMARY OF THE INVENTION

The invention demodulates a signal that does not convey information by its amplitude. A received signal is typically filtered and mixed down to an intermediate frequency. The modulated signal amplitude is fixed at a constant level. This can be accomplished by applying the IF signal to a limiting amplifier. The signal is then typically digitized by an analog-to-digital converter. A flip-flop can be utilized as a 1-bit analog-to-digital converter.

The invention then determines the cross-product of the baseband signal complex envelope with a delayed copy of itself. The IF signal can be applied to a quadrature demodulator for mixing to baseband I and Q signals. The baseband I and Q signals are each applied to delay elements. In one embodiment of the cross-product multiplier, the I signal and the delayed Q signal are applied to a first multiplier. The Q signal and the delayed I signal are applied to a second multiplier. The second multiplier output is subtracted from the first multiplier output to generate a cross-product output.

To decode a digital FSK signal, the cross-product output can be applied to a data slicer to square-up the output signal. The data slicer may operate by applying the cross-product output to a lowpass filter to generate a reference level. The reference level and the cross-product output are then applied to the inputs of a comparator. The comparator output constitutes a 1-bit recovered signal.

To further improve decoding of a digital signal, the data slicer output can be applied to a matched filter. One matched filter embodiment may include a shift register, which shifts in a number of data slicer bits equal to the samples per recovered data bit. The matched filter output then equals the most prevalent value stored in the filter taps.

BRIEF DESCRIPTION OF THE DRAWINGS

FIG. 1 of the drawings is a block diagram of a first embodiment of the invention designed to receive an analog FM signal.

FIG. 2 of the drawings is a schematic block diagram of the RF front end of the first receiver embodiment.

DETAILED DESCRIPTION OF THE DRAWINGS

Figure 3:
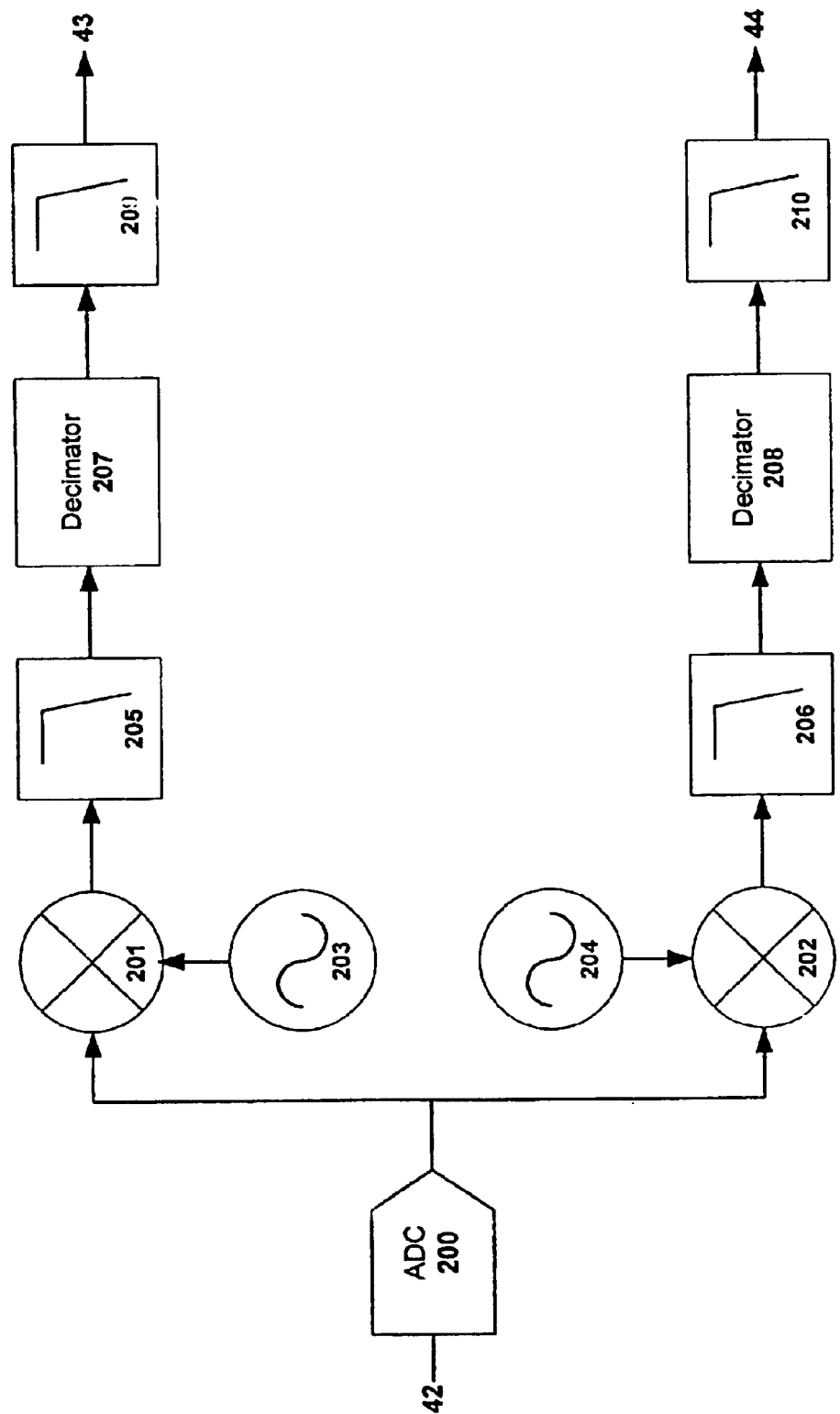
FIG. 3 of the drawings is a block diagram of the digital downconverter section of the first embodiment.

While this invention is susceptible to embodiment in many different forms, there are shown in the drawings and will be described in detail herein several specific embodiments, with the understanding that the present disclosure is to be considered as an exemplification of the principle of the invention and is not intended to limit the invention to embodiments illustrated.

In the embodiment of FIG. 1, an external antenna or signal source applies a received modulated signal to receiver front end 10 via connection 41. Front end 10 mixes the signal to an intermediate frequency (IF) before passing the IF signal to digital downconverter 20 via connection 42. Finally, digital downconverter 20 outputs digital I and Q baseband signals, via connections 43 and 44 respectively, to demodulator 30. Demodulator 30 outputs the recovered signal via connection 45.

A schematic block diagram of receiver front end 10 is shown in FIG. 2. The received signal 41 is amplified by gain block 101, and filtered by bandpass preselector 102. The signal in the illustrated embodiment is then mixed down to an IF of 10.7 MHz by mixer 103 and local oscillator 104. The IF signal is filtered again by channel filter 105. The particular design of front end 10 through channel filter 105 is typical of many superheterodyne receivers. Furthermore, circuit elements within receiver front end 10 can be changed or eliminated, as is known in the art, depending upon the particular specifications to which the receiver is designed.

The signal at the output of channel filter 105 is applied to limiting amplifier 106. Limiting amplifier 106 typically has a large amount of gain. The purpose of limiting amplifier 106 is to limit the output swings at connection 42 between a maximum level and a minimum level independent of the input signal level, such that the input signal frequency information is preserved, but such that the output amplitude is always clipped to a constant value. Optional filter 107 is shown included following limiting amplifier 106 to eliminate unwanted harmonics.

FIG. 3 depicts digital downconverter 20. The limited IF signal is digitized by analog-to-digital converter ("ADC") 200. In the illustrated embodiment, a D flip-flop is used as ADC 200, undersampling at a rate of 9.216 MSPS ("megasamples per second"). The D flip-flop acts as a 1-bit ADC. Use of the flip-flop provides for an inexpensive ADC solution, and simplifies the implementation of the subsequent digital circuitry by simplifying implementation of the quadrature demodulator multipliers. However, if increased receiver performance is required, a conventional multi-bit ADC can be utilized. While an embodiment utilizing a multi-bit ADC would require slightly more complexity in its implementation, such an embodiment is functionally identical to that depicted in the drawings, and its implementation would be known to one of ordinary skill in the art given the disclosure contained herein.

The digitized signal is applied to the quadrature demodulator, comprised of multipliers 201 and 202, and oscillators 203 and 204. As is typical of a quadrature demodulator, the signal generated by oscillator 203 is equal to $\cos(2 \cdot \pi \cdot f_1 \cdot t)$, while the signal generated by oscillator 204 is equal to $\sin(2 \cdot \pi \cdot f_1 \cdot t)$. Frequency $f_1$ is chosen such that the desired signal is mixed to baseband. Accordingly, in the illustrated embodiment $f_1$ is chosen to be 1.484 MHz. Because of the 1-bit input signal generated by virtue of the use of a D flip-flop, the signals generated by oscillators 203 and 204 are multiplied by either +1 or −1, thereby requiring only a sign change depending upon the sampled value. If ADC 200 comprised a multi-bit ADC, the design would require multipliers 201 and 202 to be more complex, true arithmetic multipliers.

The output of mixers 201 and 202 includes the baseband I and Q signals, each having additional higher frequency terms. The signals are therefore filtered by lowpass filters 205 and 206 respectively, to eliminate some of the undesired higher frequency signal components.

In order to simplify the remaining digital circuitry, the filtered I and Q signals are decimated. The signals pass through 10:1 decimators 207 and 208, thereby reducing the signal data rate from 9.216 MSPS to 921.6 kSPS. By decimating the I and Q signals, the subsequent lowpass filters 209 and 210 can provide improved attenuation of undesired frequency content while utilizing a filter that is simpler and more economical to implement than that which would be required if operating on the undecimated signal. Outputs 43 and 44 contain the final baseband I and Q signals, respectively.

Figure 4:
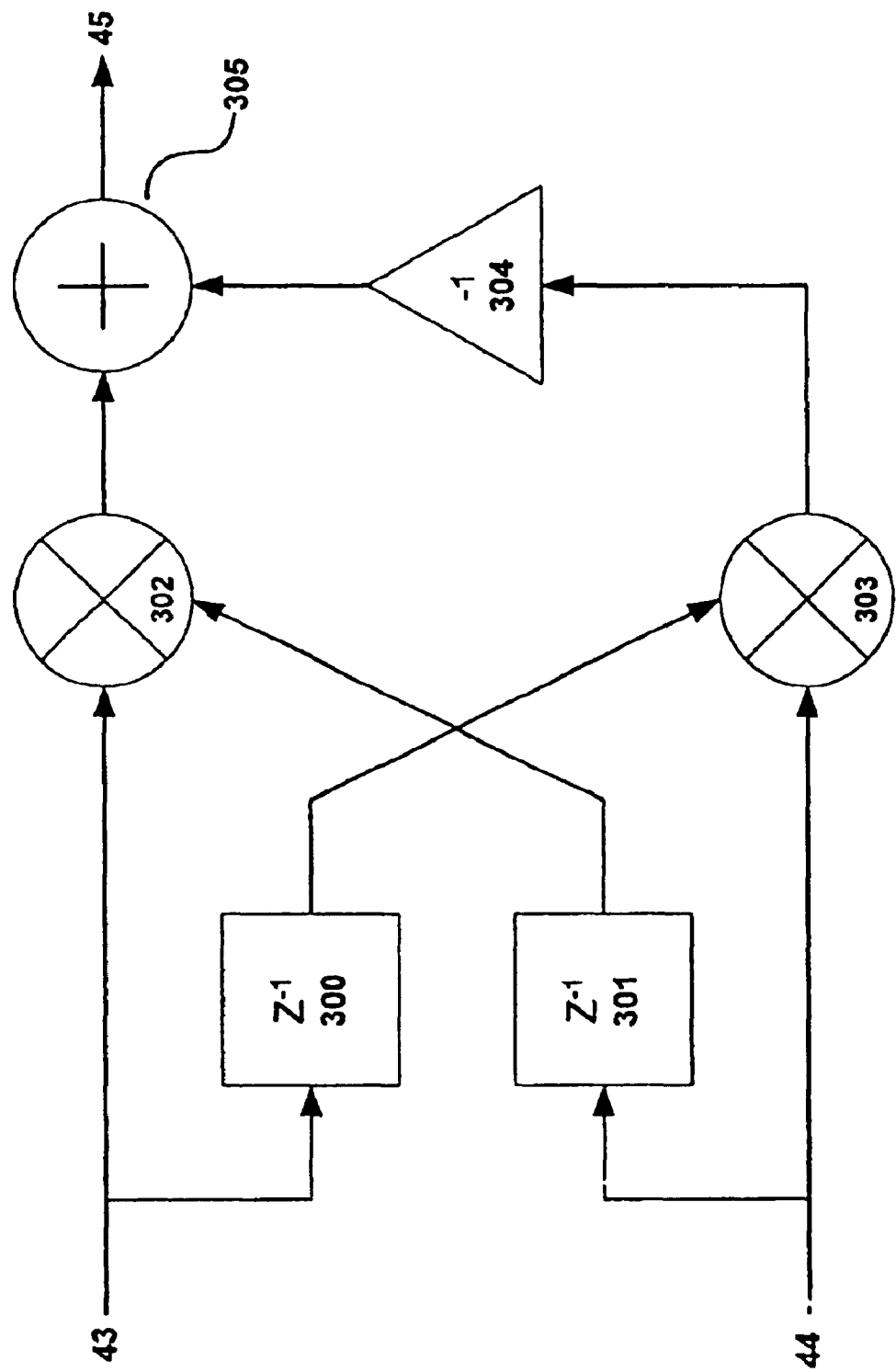
FIG. 4 of the drawings is a block diagram of the demodulator section of the first embodiment.

The signals on lines 43 and 44 then pass to demodulator 30, shown in FIG. 4. The complex envelope of the baseband signal is treated as a time series of sampled phasors, which are in fact vectors on the real and imaginary (or I and Q) axes. Accordingly, as the frequency deviation from the carrier of the transmitted signal increases, the frequency magnitude in the baseband signal increases, and in turn, the magnitude of the phase angle increases between two sampled phasors separated by a given time. Therefore, the phase angle between samples of the complex envelope is related to the original modulating signal. The direction of phasor rotation reflects the sign of the original modulating signal, or rather, the deviation of the modulated signal above or below the carrier.

Demodulator 30 is implemented using the principle that the cross product of two vectors is equal to the product of their magnitudes and the sine of the angle between them. Therefore, demodulator 30 determines the cross product of consecutive phasors. Because the signal was previously limited to a constant amplitude by limiting amplifier 105, the product of the phasor magnitudes becomes a constant. Therefore, the result of the cross-product is proportional to the sine of the angle between consecutive phasors. One could then recover the original modulating signal by taking the output of an arcsine calculation on the scaled output of the cross-product, thereby resulting in the phase angle between the phasors, which is directly proportional to the original modulating signal. However, due to the periodic nature of the arcsine function, to ensure a single determinable result the system must be designed to satisfy the constraint that the magnitude of the phase angle between samples always remains below pi.

However, a well-known small angle approximation states that for small angles, the sine of an angle can be approximated to be equal to the angle itself. In the preferred embodiment, the data rate of the cross-product input, 921.6 kSPS, is high enough that the maximum possible phase angle between consecutive samples of the baseband signal, which spans the range ±24 kHz, is within the range of accuracy for the small angle approximation. The invention implementation is consequently simplified because the arcsine calculation is not required. The cross-product output is approximately directly proportional to the angle between adjacent phasors, which is proportional to the original modulating signal. The minimum data rate required for this approximation (and hence the maximum allowable phase angle between adjacent phasors) will depend upon the maximum signal frequency deviation of the modulated signal, and the demodulated signal amplitude accuracy required for the application. Oftentimes greater accuracy will be desired for demodulation of analog FM signals for which the precise frequency deviation constitutes the desired recovered waveform, while a binary. FSK receiver may be more interested only in the direction of phasor rotation, rather than an accurate measurement of the actual phasor angle. For many applications, good performance can be obtained by keeping the maximum angle between adjacent phasors below ±11 pi, which will ensure approximately 2% or less error due to the use of the small angle approximation. Differing system specifications may allow more or less maximum angle between adjacent phasors.

FIG. 4 illustrates one embodiment of demodulator 30. The embodiment of FIG. 4 implements a process derived by applying trigonometric identities to the cross-product equation for a complex signal to arrive at the implemented calculation: $C_n \times C_{n-1} = I_n \cdot Q_{n-1} - Q_n \cdot I_{n-1}$. The inputs to multiplier 302 consist of the I signal on line 43, and the output of Q signal delay element 301. The inputs to multiplier 303 consist of the Q signal on line 44, and the output of I signal delay element 300. In the preferred embodiment, delay elements 300 and 301 each provide one sample of delay. The output of multiplier 303 is inverted by inverter 304, and then added to the output of multiplier 302 by adder 305. The output of adder 305 at line 45 is the recovered modulating signal.

Figure 5:
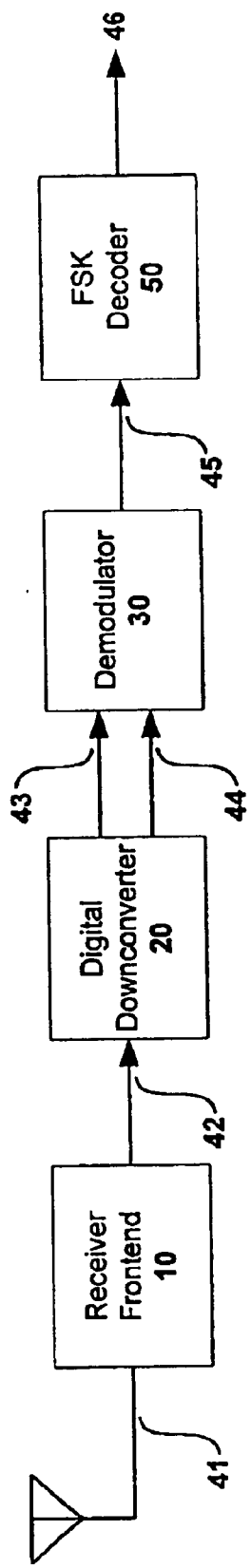
FIG. 5 of the drawings is a block diagram of a second embodiment of the invention designed to receive a digital Frequency Shift Key signal.

When the invention is utilized to implement a digital FSK receiver, it may be desirable to add additional circuitry to decode the signal with improved performance. FIG. 5 depicts an embodiment for receiving digital signals. The demodulator output on line 45 is passed to FSK decoder 50.

Figure 6:
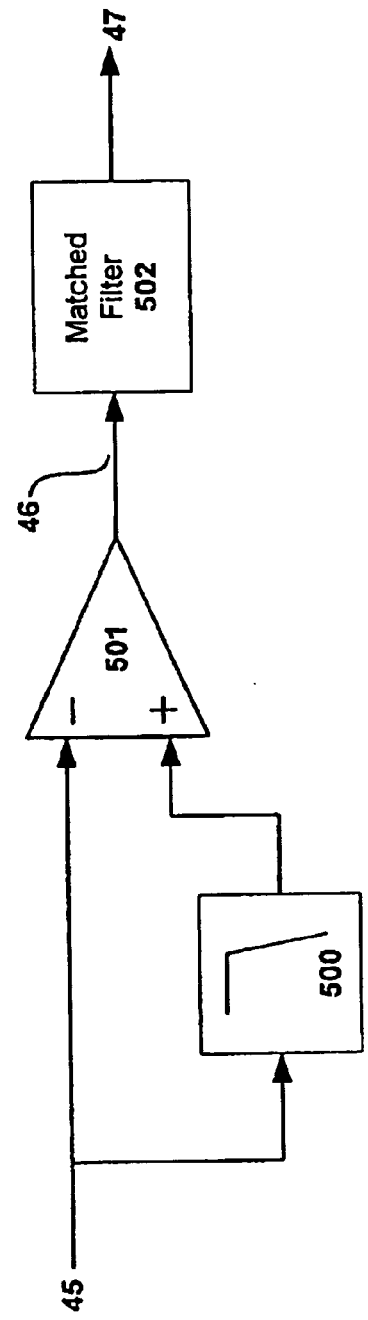
FIG. 6 of the drawings is a block diagram of the FSK decoder section of the second embodiment.

FIG. 6 illustrates an embodiment of FSK decoder 50. Demodulator output 45 is applied to a data slicer, which converts the demodulator output into a squared-up 1-bit data signal. The demodulator output is applied to lowpass filter 500 to determine the data slicer reference level, which is typically an average demodulator output level. The reference level and the demodulator output are then applied to comparator 501, such that the comparator 501 output is one of two values, depending upon whether the demodulator output is above or below the reference level for any given sample. While FIG. 6 illustrates a preferred embodiment of a data slicer, it is envisioned that other data slicing techniques known in the art could be used instead.

Figure 7:
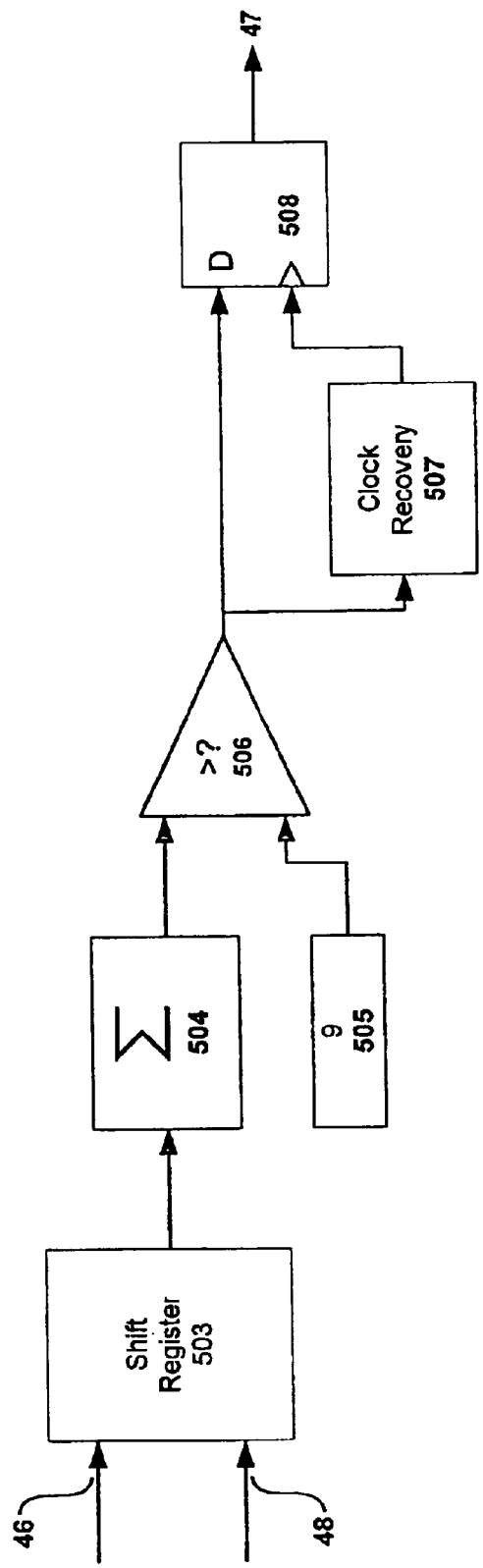
FIG. 7 of the drawings is a schematic block diagram of one embodiment of the FSK decoder matched filter.

The output of comparator 501 is applied to matched filter 502 via connection 46 to further improve the error resistance of FSK decoder 50. FIG. 7 demonstrates one embodiment of matched filter 502. Matched filter 502 takes advantage of the fact that the data rate of the recovered signal coming out of demodulator 30 is much greater than the bit rate of the data that is ultimately to be recovered. In the illustrated embodiment, the data rate of the transmitted signal is 48 kbps ("kilobits per second"). However, the rate of the signal at the output of demodulator 30 is 921.6 kSPS. Therefore, each bit of recovered data spans 19 samples at the demodulator output. Accordingly, matched filter 502 includes a 19-bit shift register 503, which is clocked by a 19×(921.6 kHz) clock signal on line 48. The shift register contents are then summed by adder 504. The running total of the shift register contents is compared to a constant value 9, block 505, by comparator 506. The output of comparator 506 therefore indicates whether the most prevalent bit value in the shift register is 1 or 0.

The output of comparator 506 is applied to D flip-flop 508. Clock recovery circuit 507 utilizes the output of comparator 506 to derive a synchronized 1×(48 kHz) clock signal, which is then used to clock D flip-flop 508. The design of clock recovery circuit 507 is known in the art of digital receivers, and therefore has not been illustrated. D flip-flop 508 outputs the most prevalent value in shift register 503 on line 47 at the end of each data bit period, when all samples of the data bit have been loaded into the shift register.

The foregoing description and drawings merely explain and illustrate the invention and the invention is not limited thereto except insofar as the appended claims are so limited, inasmuch as those skilled in the art, having the present disclosure before them will be able to make modifications and variations therein without departing from the scope of the invention. It is envisioned that the circuits described herein could be implemented via numerous possible combinations of discrete digital hardware, custom and configurable integrated circuits, and software programmable devices by one of ordinary skill in the art without departing from the scope of the invention.

We claim:

1. A method for demodulating a frequency-modulated signal, comprising:

generating a first signal by fixing the modulated signal amplitude at a predetermined level;

generating a second signal by delaying the first signal;

generating an output signal by determining the cross product of the first signal and the second signal, squaring up the output signal by applying the output signal to a data slicer, wherein squaring up the output signal comprises the following substeps:

generating a reference level signal by lowpass filtering the cross-product output;

applying the output signal and the reference level signal to the inputs of a comparator;

whereby the comparator output consists of a squared up demodulated signal, whereby the output signal is representative of the demodulated signal; and applying the data slicer output to a matched filter to reduce the likelihood of errors in the demodulated signal.

2. The method of claim 1, in which the number of taps in the matched filter is equal to the ratio between the data rate of the data slicer output and the bit rate of the demodulated signal.

3. A method for demodulating a frequency modulated signal, comprising:

amplifying the modulated signal using a limiting amplifier;

digitizing the limited signal using an analog-to-digital converter;

applying the digitized limited signal to a quadrature demodulator to create a first I signal and a first Q signal;

creating a second I signal by delaying the first I signal;

creating a second Q signal by delaying the first Q signal;

generating a first product by multiplying the first I signal by the second Q signal;

generating a second product by multiplying the first Q signal by the second I signal;

subtracting the second product from the first product to generate a demodulated signal;

squaring up the demodulated signal by applying the demodulated signal to a data slicer, wherein squaring up the demodulated signal is comprised of the following substeps:

generating a reference level signal by lowpass filtering the demodulated signal; comparing the demodulated signal with the reference level signal to generate a squared up output signal; and applying the data slicer output to a matched filter to reduce the likelihood of errors in the demodulated signal.

4. The method of claim 3, in which the number of taps in the matched filter is equal to the ratio between the data rate of the data slicer output and the bit rate of the demodulated signal.

5. An apparatus for demodulating a frequency modulated signal, the apparatus comprising:

a limiting amplifier, which amplifier's input receives the frequency modulated signal;

an analog-to-digital converter, which converter operationally receives the limiting amplifier output signal and generates a digitized frequency modulated signal;

a cross-product multiplier which receives the digitized frequency modulated signal and outputs the cross-product of the digitized frequency modulated signal with a delayed copy of the digitized frequency modulated signal to generate a demodulated output signal; and a data slicer with input operably connected to the cross-product multiplier output wherein the data slicer is comprised of:

a lowpass filter, which filter receives the data slicer input;

a comparator with inputs of the data slicer input, and the lowpass filter output, whereby the comparator outputs the squared up demodulated signal; and a matched filter with input operably connected to the data slicer output, which matched filter provides for correction of errors in the data slicer output.

6. The apparatus of claim 5, in which the analog-to-digital converter is a flip-flop generating a 1-bit digital output.

7. The apparatus of claim 5, in which the cross-product multiplier is comprised of:

a quadrature demodulator with an input connected to the analog-to-digital converter output, which quadrature demodulator generates a baseband I output and a baseband Q output;

a first delay element, which element receives the I output of the quadrature demodulator, a second delay element, which element receives the Q output of the quadrature demodulator;

a first multiplier, which multiplier has as its inputs the I output of the quadrature demodulator and the output of the second delay element;

a second multiplier, which multiplier has as its inputs the Q output of the quadrature demodulator and the first delay element;

an inverter which receives the output of the second multiplier;

an adder, which adder has as its inputs the output of the first multiplier and the output of the inverter;

whereby the adder output is the demodulated signal.

* * * * *